(12) United States Patent
Kamenicky et al.

(10) Patent No.: US 8,093,924 B2
(45) Date of Patent: Jan. 10, 2012

(54) LOW SIDE DRIVER

(75) Inventors: Petr Kamenicky, Brno (CZ); Pavel Horsky, Brno (CZ)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/188,962

(22) Filed: Aug. 8, 2008

(65) Prior Publication Data
US 2009/0051393 A1  Feb. 26, 2009

(30) Foreign Application Priority Data
Aug. 22, 2007 (EP) .................................... 07075715

(51) Int. Cl.
*H03B 1/00* (2006.01)
(52) U.S. Cl. ........................................ 327/108; 327/170
(58) Field of Classification Search ........................ None
See application file for complete search history.

(56) References Cited

U.S. PATENT DOCUMENTS

| | | | |
|---|---|---|---|
| 5,510,699 A | 4/1996 | Theus et al. | |
| 5,966,041 A | 10/1999 | Moane | |
| 6,043,680 A | 3/2000 | Dasgupta | |
| 7,054,609 B2 * | 5/2006 | Wiklund et al. | 455/323 |
| 7,154,918 B2 * | 12/2006 | Takauchi et al. | 370/537 |
| 7,420,395 B2 * | 9/2008 | Kuramasu | 326/83 |
| 7,586,369 B2 * | 9/2009 | Kobayashi et al. | 330/10 |
| 2004/0169237 A1 | 9/2004 | Nishikawa et al. | |
| 2007/0159219 A1 | 7/2007 | Ronan et al. | |

FOREIGN PATENT DOCUMENTS

| | | |
|---|---|---|
| EP | 1280033 A | 1/2003 |
| GB | 2323175 A | 9/1998 |

* cited by examiner

*Primary Examiner* — Long Nguyen
(74) *Attorney, Agent, or Firm* — Rennie William Dover

(57) ABSTRACT

An output driver circuit has an input, an output node, and first and second transistors coupled in series between the output node and a first source of operating potential. Parasitic diodes of the first and second transistors are anti-serially coupled. The output driver circuit has first and second control circuits coupled to control the first and second transistors respectively. The first transistor is controlled as a controlled current source depending on a signal at the input during normal conditions when the current that flows through the output is in a first direction, and the second control circuit controls the second transistor to prevent unwanted DC current at the output from flowing through the output in a second direction. The first and second transistors are also controlled to limit unwanted transient currents during an EMC disturbance substantially symmetrically.

34 Claims, 4 Drawing Sheets

LOW SIDE DRIVER

TECHNICAL FIELD

The present invention relates, in general, to integrated circuits and, more particularly, to analog or digital driver circuits and methods of driving and manufacturing the analog or digital driver circuits.

BACKGROUND

Various types of driver circuits are known having an output driven by a transistor controlled according to a signal on an input. In principle their output can drive a load coupled to a higher power supply (low side driver) or can drive a load coupled to a lower power supply (high side driver). They can have many different circuit implementations to suit a wide variety of applications.

An example of a classical low side driver has an output pin driven by an NMOS output transistor. Another NMOS transistor together forms a current mirror (with typically large mirroring ratio) which is driven by a transconductance stage Gm. Feedback is taken from the output pin through a resistive feedback divider. For high voltage applications the transistor can be an NDMOS type transistor. The output transistor can be cascoded by adding a further NMOS or NDMOS transistor in series with the output transistor.

The main disadvantage of this driver topology arises from the fact that such transistors have built in intrinsic drain bulk diodes. For normal operation these diodes are reverse biased so that current does not flow through them. But if the output voltage goes below ground, these diodes are activated allowing uncontrolled current flow through the output transistor drain bulk diode and the output. Due to this the circuit cannot provide protection against mis-wiring and missing ground faults.

Furthermore, during EMC disturbances the intrinsic diode of the output transistor can be activated. The charge moved out during the negative part of the disturbance period is much higher than the charge the driver is able to take during the positive part of the disturbance period (limited by the current capability (size) of the output transistor). This charge non-equivalency causes a positive DC level shift on the output during the EMC disturbance.

Drivers can be provided with a diode in series with output transistor to block the output current when the output pin is below ground. A diode in series with the output driver transistor is typical in vehicle networking drivers like CAN (Controller Area Network) or LIN (Local Interconnect Network). Although the EMC performance of this solution is much better (if the gain bandwidth (GBW) of the driver is much lower than the EMC disturbance frequency), the presence of the diode prevents the use of this solution for drivers with desired output voltages closer to the supply than one diode threshold voltage.

It is known from EP1280033 that traditional transconductance regulators are not EMC safe, thus electromagnetic interference will usually lead to instability of the output. Traditional solutions consist of adding filters in the input line for filtering out the EMC noise on this input signal. Such filters are very expensive and require external components. Hence this document proposes a voltage regulator circuit for providing a regulated output voltage at an output terminal, said regulator circuit comprising a current source (Icontrol) comprising a current source MOSFET, a current mirror circuit comprising a driver MOSFET, and a follower MOSFET interposed between said current source and said output terminal, operatively linked as to regulate an input voltage Vin to said regulated output voltage, and an EMC stabilizing MOSFET having its drain connected to its substrate and placed in series with any of said driver or follower MOSFETs. A PMOS with its bulk or substrate connected to the drain is used as EMC protection between the device to be protected and the node with the EMC disturbance. Any diode between the input supply and the regulated supply is thereby eliminated by means of an additional diode in an anti-series connection.

It is known from U.S. Pat. No. 7,119,999 to provide a reverse current blocking technique for a voltage regulator which does not employ PMOS, bipolar PNP, or external circuit current blocking devices to block the current flow when the supply connection is reversed. This document proposes a voltage regulator employing reverse current blocking via a lateral double-diffused MOS (LDMOS) device to block the current flow when the supply connection is reversed. By using an N-channel MOS transistor to block the current flow when the supply connection is reversed, less area is needed than if PMOS devices were used. When connected properly, the body diode conducts to provide a start-up function. A pre-regulator using the N-channel MOS transistor also employs a bias generator to enable the low drop-out voltage function, allowing the output voltage to be very close to the supply voltage.

It is known from EP0954079 that two NDMOS devices with anti-serially connected drain bulk diodes can be used for protection of output drivers which should achieve low output voltages. The protection transistor MP is operated as a switch, it is on during normal operation. When the output voltage goes below ground, a comparator detects this state and switches off the protection transistor MP. This document proposes circuits to enable faster switching off of the MP transistor in case the OUT voltage goes below ground. A disadvantage of this solution is a delay time needed for the circuit to switch off. Even if it is faster than the prior art, there is still remaining a delay of the comparator and the switch M. During the interval before the switch is switched off, the inverse current is on the order of several amperes. Another disadvantage of this circuit is a lower EMC performance due to the presence of this very high reverse current.

SUMMARY OF THE INVENTION

Generally the present invention provides driver circuits and methods of driving and manufacturing the same. An advantage of the present invention is that it can be used for an EMC and transient overvoltage pulse immune on-chip analog or digital driver system and can avoid expensive external solutions (ferrite filters) especially if no external RC filter is allowed. Another advantage is that it can be used if mis-wiring protection on the output pin is required and also it can be used for drivers with zero output current under a missing ground condition. The present invention provides in an embodiment an analog or digital driver for an electronic component such as an integrated circuit, e.g. an ASIC, which is immune or has increased immunity to EMC disturbances on the output line, can handle negative transient overvoltage pulses on the output line, is tolerant to mis-wiring (e.g. can withstand negative, DC, not current limited voltage sources connected to the output) and also can be used for drivers with zero output current under a missing ground condition (e.g. if the ground connection to the chip is lost, the chip should not take any current from the output pin, e.g. through a parasitic diode, if the output pins is at lower potential than the lower supply). The driver can provide, for example, a precise analog output voltage which can be very close to the lower supply VSS (e.g. 180 mV) and shows little or no output voltage drift during EMC disturbances coupled to the output pin for induced EMC amplitudes of a few volts (e.g. it can pass the DPI susceptibility test, 4W according to IEC 62132-4).

According to a first aspect, the invention provides an output driver circuit having an input, an output, a supply, a first and a second transistor coupled in series between the output and the supply, parasitic diodes of the first and the second transistor are anti-serially coupled, and having first and second control circuits or control loops coupled to control the first and second transistors respectively, the first control circuit or loop being arranged to control the first transistor as a controlled current source depending on a signal at the input to thereby control a parameter (such as voltage or current) on the output, during normal conditions when current flow through the first and second transistors and through the output is in a first direction, and the second control circuit or control loop being arranged to control the second transistor to prevent unwanted DC current at the output from flowing through the first and second transistors if the output is in a second direction, and the first and second control circuits or loops being arranged to cause the first and second transistors to limit unwanted transient currents during an EMC disturbance on the output, so as to limit such currents in the first and the second direction substantially symmetrically. The intrinsic parasitic bulk drain diodes of the transistors cannot be avoided, so the present invention includes blocking the current by connecting them anti-serially. The controlled parameter on the output can be a voltage or a current.

Preventing DC current in the second direction, as claimed, is useful for protecting against mis-wiring faults or zero output current under a missing ground condition for example. At the same time, limiting transients symmetrically as claimed, can also help reduce susceptibility to the EMC disturbance, compared to non symmetrical limiting. For example for typical loads having some capacitance, any unsymmetrical limiting is likely to cause unsymmetrical charging and discharging of such capacitance and result in an increasing voltage error on the output. Hence the circuitry can address the potentially conflicting requirements of preventing uncontrolled rise of current (as well as destruction of driver transistor) when the output of a driver is forced below ground, without using rectifiers, at the same time as providing symmetrical output current to enable good EMC resilience. Embodiments of the invention may have any additional features added to the features of this aspect. Some such additional features are described and claimed in dependent claims. Other aspects of the invention include corresponding methods of using or making such circuits.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
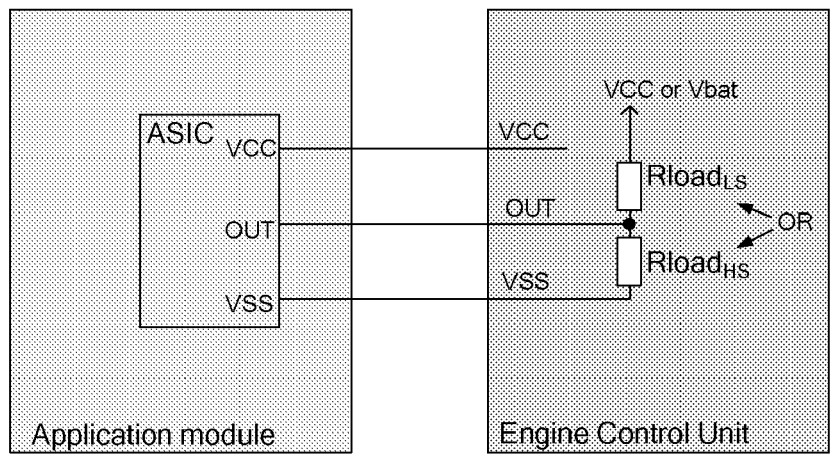
FIGS. 1 to 3 show schematic views of an application module having a driver circuit and a load with failure conditions like broken ground VSS or supply VCC line.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B. Similarly, it is to be noticed that the term "coupled" should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still cooperate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein may include some but not other features included in other embodiments, combinations of features of different embodiments are meant to be within the scope of the invention, and form different embodiments, as would be understood by those skilled in the art. For example, in the following claims, any of the claimed embodiments can be used in any combination. In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Reference will be made to transistors. These are three-terminal devices having a first main electrode such as a drain, a second main electrode such as a source and a control electrode such as a gate for controlling the flow of electrical charges between the first and second main electrodes. It will be clear to a person skilled in the art that the present invention is also applicable to similar devices that can be configured in any transistor technology, including for example, but not limited to, CMOS, BICMOS, Bipolar and SiGe BICMOS technology.

Furthermore the findings of the present invention are explained with reference to CMOS technology, i.e. PMOS and NMOS transistors as an example, but the present invention includes within its scope a complementary device whereby PMOS and NMOS transistors become NMOS and PMOS transistors, respectively. A skilled person can make such modifications without departing from the true spirit of the invention.

In describing the invention reference will mainly be made to analog driver circuits. The driver circuits according to embodiments of the present invention can find advantageous use as analog drivers, where the output voltage has to go close to the supply voltage and no diode in series with the driver is allowed. However, it may be also utilized in digital output drivers with the advantage of mis-wiring and transient overvoltage pulse protection and good EMC resilience and also with the advantage, that the driver output can go close to the supply. It can be used in the output stage of digital in-vehicle (automotive) networking drivers or in drivers with pulse width modulation, where the duty cycle of the pulse is transferring the information. It can be used also for drivers with low EMC emissions done by controlled slopes of rising and falling edges of the output digital (pulse) signal.

Another feature in accordance with embodiments of the present invention is the second control circuit or loop being arranged to sufficiently bias the second transistor to conduct the output current when a desired voltage at the output is within a diode threshold voltage of a voltage at the supply. This means a low voltage drop on the second transistor for low voltages on the output and for higher voltages on the output (above a diode threshold voltage) the current can flow through the bulk diode D2. This can be useful to maintain output linearity at low output voltages to help enable the range of useful output voltage to be enlarged.

Another such additional feature is the bulk of the first transistor is coupled to the supply and the bulk of the second transistor is coupled to the output.

Another such additional feature (for a high voltage driver) is the first and/or the second transistor being an NDMOS device.

Another such additional feature is a feedback path from the output to the first and second control circuits or loops.

Another such feature is the first control circuit or loop having a third transistor coupled to form a current mirror.

Another such feature is the second control circuit or loop having a fourth transistor controlled by the input signal and an output coupled through a diode to a gate of the second transistor, the second control circuit or loop also having a fifth transistor, coupled to have a common gate and common source with the second transistor (forming a current mirror with the second and the fifth transistor). This is one way of ensuring the second transistor will be sufficiently biased to conduct the output current at low voltages on the output including negative voltages during EMC conditions.

Another such feature is that the gains of the first and second control circuits or loops are preferably not the same.

Another feature is that the second control circuit or loop is set to a fixed current, e.g. higher than a maximum required output current. This can be a less preferred embodiment compared to the embodiment where the currents are symmetrical. Another such additional feature is the circuitry being arranged so that there is no parasitic substrate diode connected directly or through a forward biased diode to the output.

Another such feature is further circuitry provided for isolating a gate of the fifth transistor from a drain of the fifth transistor in the event of a missing supply condition. This can help overcome a problem of too much leakage through the output during a missing ground condition, particularly at higher temperatures.

Another such additional feature is the feedback path having circuitry for switching off the feedback path under conditions of missing supply (when the driver is not supplied).

Another such additional feature is that both control loops are using the same error signal.

Another such additional feature is the driver circuit being a low side driver.

Another such feature is the circuit having next to the low side a high side driver connected to the same output, and a selector for selecting either the high side or the low side driver.

Embodiments of the invention can encompass an output driver comprising one or more of:
(a) First and second transistors coupled in series between the output to be driven and a supply (e.g. ground for a low side driver).

(b) The parasitic drain bulk diodes of the first and second transistors are coupled anti-serially.
(c) A first control loop to drive the first transistor.
(d) A second control loop to drive the second transistor.
(e) First and second control loops that use the same error signal.

The present invention also provides a method of operating such an output driver having a first transistor (MN1) and a second transistor (MN3) coupled in series between the output to be driven and a lower (higher) supply, said method consisting in:
(a) operating the second transistor (MN3) as a controlled current source when the output voltage is lower (or higher) than the lower (or higher) supply voltage,
(b) operating second transistor (MN3) as a closed switch when the output voltage is higher (or lower) than the lower (or higher) supply voltage.

Another method involves controlling the current flowing (i.e. limit the current when V (OUT) is forced below the lower supply) through first (MN1) and second (MN3) serially coupled transistors, the method having the steps of:
operating the first transistor as a controlled current source when the current is flowing in a first direction, and
operating the second transistor as a controlled current source when the current is flowing in a second direction.

Another method involves controlling the current flowing through a first and a second serially coupled transistor, the method having the steps of:
generating a first control signal to operate the first transistor as a controlled current source when the current is flowing in a first direction, generating a second control signal to operate the second transistor as a controlled current source when the current is flowing in a second direction.

Some of the embodiments described are suitable for use in a low side driver circuit or for use in an output stage of a combined high side—low side driver circuit. The driver circuit can be analog or digital. These driver circuits can be used in safety relevant applications or for working in a harsh automotive environment, or in other applications. During failure conditions such as a missing ground or supply connection, in some embodiments it is useful for the output of the drivers to be arranged to stay at a diagnostic level (this means that only very small output current can flow). Embodiments can be designed for the harsh automotive environment with respect to transient over-voltage pulses, mis-wiring and EMC performance. Embodiments can have an analog low side and high side driver combined into one output pin, selectable by an internal signal, to allow the user or customer to select the appropriate type of output driver depending on the application. The driver circuit can have a ratiometric output relative to the supply voltage (VCC) and a useful output range can be e.g. from 4% of VCC to 96% of VCC. Embodiments can be designed for automotive applications with high safety relevant requirements. If an error condition is detected by a built in diagnostic block, the output enters a diagnostic position. The diagnostic level is above e.g. 97% of the supply voltage for a low side driver and below e.g. 3% of the supply voltage for a high side driver. This applies also for an error condition when the supply (VCC) or ground (VSS) line is broken.

Figure 2:
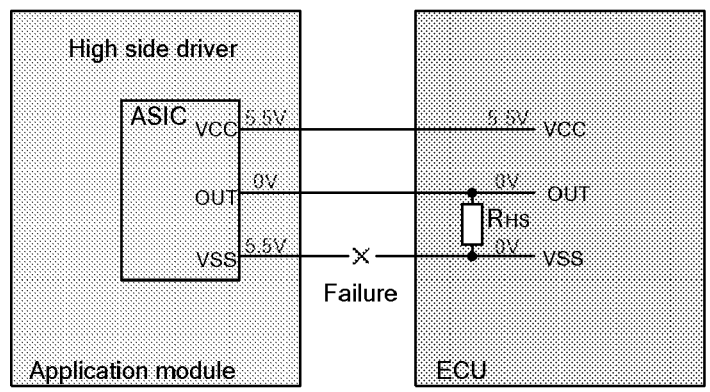
Figure 3:
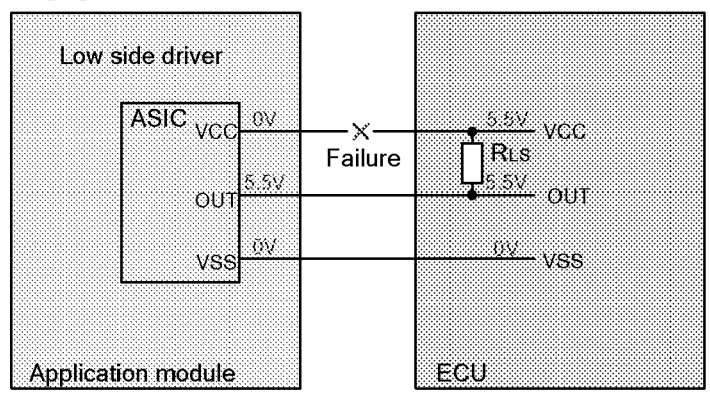

FIGS. 1 to 3 show examples of such error conditions for a system which is supplied by 5.5V, for example. They show an application module having an electronic component, e.g. an integrated circuit such as an ASIC with an output driver, and having an output OUT, a high supply VCC and a ground or low supply VSS. The output drives a load in an engine control unit ECU. The load can be resistive and be either a low side driver load $Rload_{LS}$ coupled to VCC, or a high side driver load $Rload_{HS}$ coupled to VSS. FIG. 1 shows no fault in the three connections VCC, OUT and VSS between the application module and the ECU. FIG. 2 shows the electronic component, e.g. an integrated circuit such as an ASIC arranged as a high side driver, and a fault in the VSS connection resulting in 0V at either end of the load. During this error condition the output is 5.5 V below VCC and VSS. FIG. 3 shows the electronic component, e.g. an integrated circuit such as an ASIC arranged as a low side driver, and a fault in the VCC connection resulting in 5.5V at either end of the load. During this error condition the output is 5.5 V above VCC and VSS.

For this driver to achieve low EMC susceptibility, the output structure should behave as much as possible as a linear circuit without any rectification. Other aspects for some embodiments can include mis-wiring protection when the driver has to withstand for example −5.5V DC on the OUT pin and immunity against transient over-voltage pulses during which the voltage on the OUT pin can go, for example, below −10 V.

Figure 4:
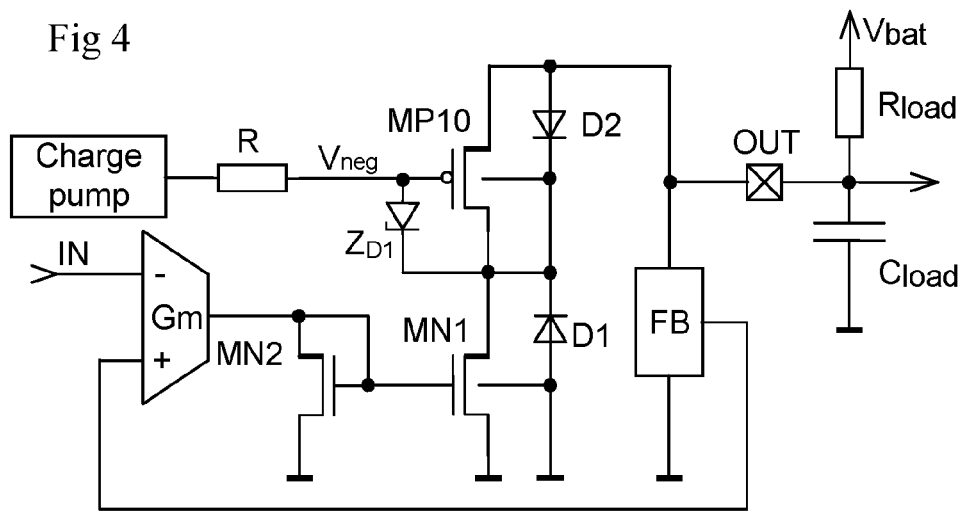
FIG. 4 is a circuit schematic of a driver circuit using a PDMOS device.

To assist in understanding FIG. 5, FIG. 4 will be described. FIG. 4 is a schematic diagram of a driver which includes a second transistor in the form of a PDMOS device (MP10) in series with a first transistor in the form of an NDMOS device MN1 transistor. Intentionally the MP10 has its bulk connected to the lower potential node (Drain of MN1). The MP10 gate is connected to a negative voltage source (charge pump) through a resistor R, and a zener diode couples the gate of MP10 and the node between MP10 and MN1. The first control circuit is shown by a third transistor MN2 coupled to form a current mirror. It is fed by an output of a transconductance device Gm, which is itself fed by the input and by a feedback path from the output, via a feedback divider FB.

The current for negative voltage on the OUT pin is limited and the driver can work with low output voltages.

A disadvantage of this solution is the bigger silicon area it requires. There are two devices (MN1, MP10) in the output current signal path, causing an area increase in order to keep the required voltage drop. One of these devices is a P type DMOS which is not silicon area effective. Additionally a negative charge pump is required. Compared to arrangements without the second transistor, this solution brings an EMC performance improvement. This improvement is limited in some cases due to the limited possibilities to set transistor MP10 gate voltage Vneg to the optimum level. During the positive part of the disturbance period on OUT, the I(OUT) is controlled by transistor MN1, while transistor MP10 is in a linear mode.

During the negative part of the disturbance period on OUT, when the OUT voltage is below ground, transistor MN1 is in a linear mode and bulk diode D1 can be in a forward mode depending on voltage drop on transistor MN1. The current I(OUT) is controlled by the size of transistor MP10 and the Vneg voltage. The Vneg voltage sets the voltage VgsMP10 equal to Vneg−VdsMN1 and controls the I(OUT) current.

The I(OUT) current during the positive and negative part of the disturbance period should not differ too much to ensure that the feed back loop can regulate the output DC voltage (with this topology it is difficult or not possible to adjust Vneg to fulfill this requirement). In summary, such an arrangement provides a reasonable EMC performance, but Ineg is typically higher than Ipos (due to the low voltage drop on MP10 during normal operation, when OUT should be able to go close to the supply), during an EMC event.

Figure 5:
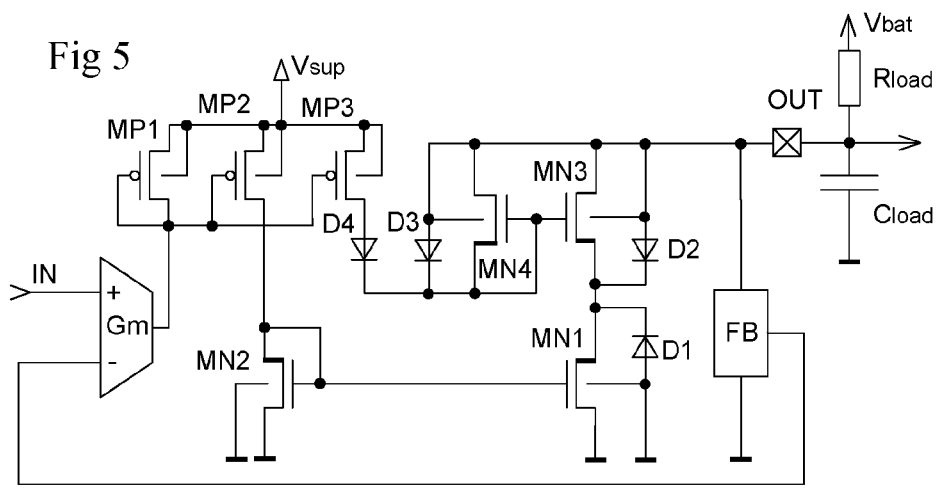
FIG. 5 is a circuit schematic of a driver circuit in accordance with an embodiment of the present invention.

FIG. 5 is a schematic diagram of a driver circuit using NDMOS devices in accordance with an embodiment of the present invention. What is shown in FIG. 5 is a second transistor in the form of an NDMOS device MN3 as the main disturbance protection element. No charge pump is needed because one can switch on both transistors with positive gate voltages and go to very low output voltages. The new circuit is using the second control loop to control the gate of MN3. The circuit in FIG. 5 contains a transconductance gain stage Gm, current mirror MP1, MP2 and MP3 which splits the output current of the transconductance stage Gm into two output currents where one current flows from the drain of transistor MP2 and other current flows from drain of transistor MP3. These two currents are mirrored by current mirrors (with typically large mirroring factor) MN2, MN1 and MN4, MN3. Diode D3 represents the intrinsic drain bulk diode of transistor MN4. The two output transistors MN1 and MN3 are serially connected. Bulk diodes of these transistors are anti-serially connected to block current from the output pin through these diodes for both polarities of the output voltage. The bulk of the first transistor is coupled to the supply and the bulk of the second transistor is coupled to the output.

A first control loop is created by feedback resistive divider FB, transconductance amplifier Gm, current mirror MP1, MP2 and output current mirror MN2 and MN1. A second control loop is created by feedback resistive divider FB, transconductance amplifier Gm, current mirror MP1, MP3 and output current mirror MN4 and MN3. Diode D4 is used to block currents from the output into supply for higher values of output voltage. Both control loops are using the same error signal and sharing the feedback resistive divider FB, transconductance amplifier GM and transistor MP1.

During normal operation, the regulation or control loop is closed via the regular MP1→MP2, MN2→MN1 path (first control loop).

The second path MP1→MP3, D4, MN4→MN3 is active for low voltages on the OUT pin. When $$V(OUT) \leq Vsup - VdssatMP3 - VtD4 - VdssatMN4 - VthMN4 \quad (1)$$

Then $$VgsMN3 = VgsMN4 \cong VgsMN1 \quad (2)$$

Assuming W/L ratio MN3/MN4·MP3/MP1 is equal to W/L ratio MN1/MN2·MP2/MP1. This means for low voltages on the OUT pin transistor MN3 will be sufficiently biased to conduct the driver output current. For high voltages on the OUT pin when expression (1) is not valid, the transistor MN3 will not be sufficiently biased and the output current (or a part of the output current) will go through the bulk diode D2. This means transistor MN3 has to be carefully guarded against latch-up.

For the following explanation we assume large signal AC operation above the gain bandwidth of the regulation loop. For negative voltages on the OUT pin one can write $$VgsMN3 = VgsMN4 \cong VgsMN1', \quad (3)$$

where VgsMN1' is the gate-source voltage of transistor MN1 during normal operation when V(OUT)>0 V.

Because the transistor MN1 drain voltage is <0V, transistor MN1 operates in the linear region. Dependent on the voltage drop over transistor MN1, the forward biased diode D1 can conduct current and transistor MN1 has to be carefully guarded against latch-up. This means that for a negative voltage on the OUT pin the output current is not limited by transistor MN1 but by the transistor MN3 (and controlled by the second control loop). The absolute value of the output current is roughly the same as for positive output voltages, assuming the Gm output current is the same.

Figure 6:
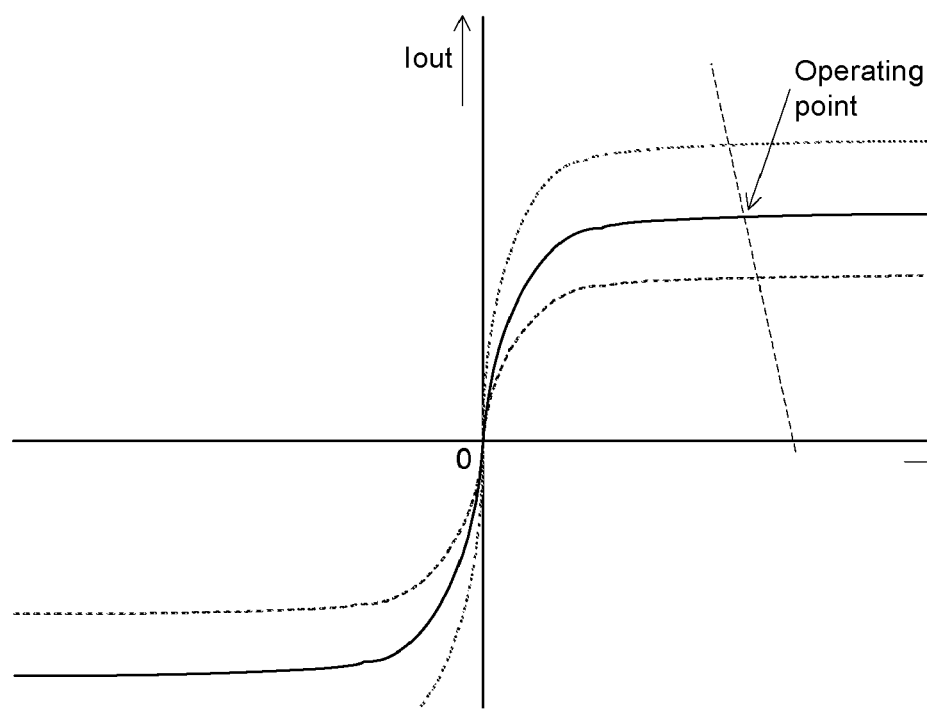
FIG. 6 is a graph of output current versus output voltage for AC large signal operation above GBW of the regulation loop for the circuit in FIG. 5.

FIG. 6 shows a graph of output current versus output voltage for different output drive levels for AC large signal operation above the GBW of regulation loop. When the output voltage is higher than 0V the output current is controlled by the first control loop and when the output voltage is lower than 0V the output current is controlled by the second control loop. FIG. 6 shows a symmetrical characteristic for currents in either direction.

Because the I(OUT) currents during the positive and negative parts of the EMC period are roughly equal in absolute value and because by default the duration of the positive part of the period when the output voltage >0V is longer than the duration of the negative part of the period when the output voltage <0V, due to desired output DC voltage >0V, there is a slight asymmetry in the I(OUT) current, causing the Cload output capacitor to be more discharged than charged (not taking the feedback loop regulation into account). Together with the Rload current, the feedback loops can easily regulate the VgsMN1 and VgsMN3 to obtain the desired OUT voltage.

During an EMC event it is important to keep the correct average voltage on the OUT pin. The frequency of the EMC disturbances, which can be coupled into the OUT pin, is typically higher than a certain frequency (e.g. 1 MHz) and the regulation loop of the driver has to be designed to have the gain band width GBW below this frequency (e.g. the GBW is in the range from 50 kHz to 300 kHz). If this is not done, the output driver will try to regulate the output, but because it is just a low side driver, it will be able to regulate only for part of the period of the EMC disturbance. This will result in a wrong average voltage level on the output. To operate correctly, the feedback GBW should be below the frequency of the EMC disturbance.

Vsup can be the internal low voltage supply. The diode D4 avoids reverse current flowing into Vsup from the OUT pin when the voltage at the OUT pin is higher than Vsup. In a case when a DC negative voltage is applied externally to the OUT pin after a certain time, depending on the GBW of the regulation loop, the Gm stage output current will be set to zero and thus the driver will be fully switched off. This is particularly beneficial for coping with slow transient overvoltage pulses as well as for mis-wiring conditions.

Another advantage of the present invention is, that both control loops are working simultaneously. This means, that the control voltages for both output transistors (MN1 and MN3) are always present during normal operation for both transistors. During fast transients or EMC disturbances, the second transistor (MN3) is already pre-biased and there is no delay time needed to change the operating point of this transistor. This is an advantage compared to circuits which use comparators to switch off any kind of protection switch because there is a first delay in the comparator and a second delay when the switch is disabled.

Some advantages of this driver topology are:
  The driver output OUT can be pulled below ground (by transient overvoltage pulses or due to mis-wiring) indefinitely without a significant output current.
  Good EMC performance as the driver output current during the negative part of the disturbance period is fully under control.
  There is no PDMOS in the driver signal path. This is very area effective as the modern vertical NDMOS's are for the same drain currents much smaller.
  There is no need for the negative charge pump.
  Missing ground protection can be implemented and the driver can by fully switched off without generating any remaining current.

A second control loop is pre-biasing the second transistor during normal operation and no delay is needed to set the correct operating point if the polarity of output current is reversed.

In CMOS technologies which are using a P substrate this solution preferably uses a technology with a floating substrate (e.g. such as AMIS I3T50). When the OUT pin goes to a negative voltage, the drain of DMOS transistor MN4 also goes to a negative voltage and because of the pocket diode of transistor MN4 a floating substrate is desirable.

Figure 7:
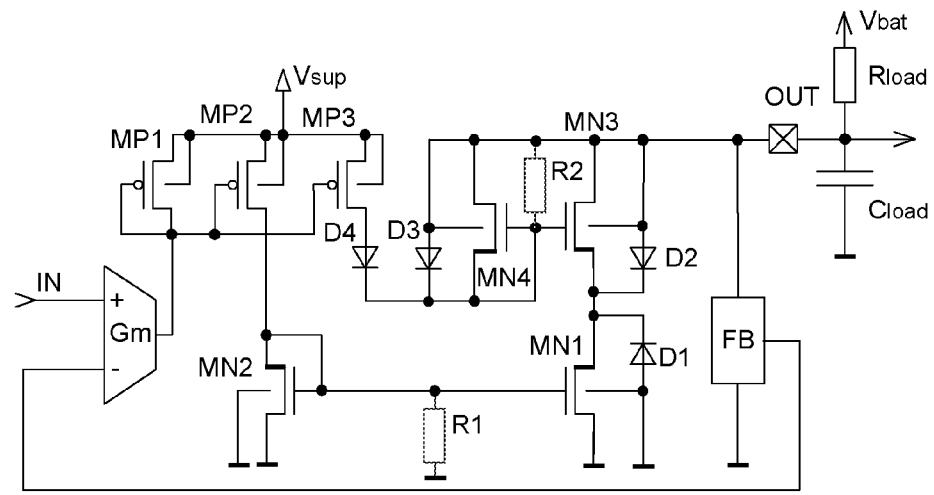
FIG. 7 is a circuit schematic of a driver circuit in accordance with another embodiment of the present invention.

FIG. 7 is a schematic diagram of a driver circuit in accordance with another embodiment of the present invention. The driver circuit of FIG. 7 is similar to the driver circuit of FIG. 5 but it includes resistors R1 and R2. These resistors (with typically very high values of resistance, e.g. on the order of few megaohms such as 1 to 9 megaohms) are used to fully switch off output current from the driver when the driver is not supplied to reach the diagnostic level on the output. The resistors R1 and R2 can also be replaced by some other devices with a leakage, where the leakage is used to fully switch off the output. As an example poly diodes in AMIS I3T50 technology can be used.

As mentioned above, the described driver shown in FIG. 5 uses technology with a floating substrate. For negative voltages on the OUT pin, the substrate is negatively biased.

When the chip is not supplied and the OUT pin goes negative towards VCC and VSS (equivalent to a missing VSS failure mode), the drain of transistor MN4 is at the lowest potential in the chip and biases the substrate. The total leakage of all pockets of the whole chip is collected here and multiplied by the ratio of sizes of transistors MN3 to MN4. As a result, for high temperatures the leakage through the OUT pin can be too high to guarantee the diagnostic level on the OUT pin, especially for high resistance values of the external resistor Rload.

Figure 8:
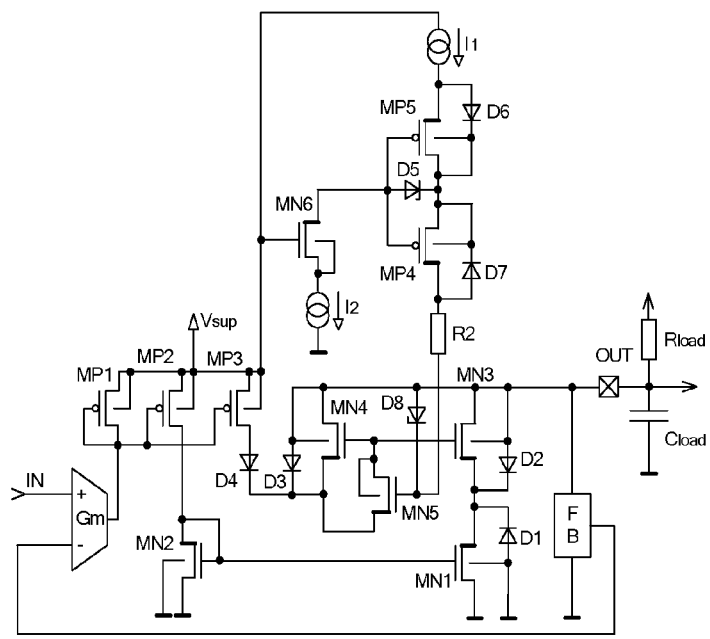
FIG. 8 is a circuit schematic of a driver circuit in accordance with another embodiment of the present invention.

This disadvantage for a missing supply condition (where no I(OUT) current is allowed) can be solved by an output driver topology where no deep N diffusion is connected directly (or through a forward biased diode for negative OUT voltages) to the OUT pin. The low side part of the driver is shown in FIG. 8.

In this figure, the gate of transistor MN4 is not directly connected to its drain. An additional transistor MN5 is used to connect the gate of transistor MN4 gate to its drain. Control of transistor MN5 is accomplished in the following way: for low V(OUT) voltages the current source I1 creates current which builds voltage over the Zener diode D8 to open transistor MN5. Current source I1 is connected to the gate of transistor MN5 through transistors MP5 and MP4. These two transistors have intrinsic drain-to-source diodes D6 and D7 and are used to protect the current source I1 and to block current in this branch when the driver is not supplied (missing ground and missing supply condition). Resistor R2 is used to limit the reverse current into current source I1 when the OUT pin is above Vsup. Under a missing supply condition (VSS or VCC cut), current I1 is not present and the leakage current from diode D8 switches transistor MN5 off. Therefore the drain to substrate diode of transistor MN4 is not seen from the OUT pin. Current source I2 (I2 current is smaller than I1 current) protected by a high voltage transistor MN6 creates a voltage drop on Zener diode D5. This voltage is used to open transistors MP4 and MP5 to allow the I1 current to flow.

As has been explained above, a low side driver part of a combined High side Low side driver has been described. It is particularly useful for safety relevant applications as it has a defined failure mode behavior, mis-wiring robustness, and robustness against EMC and transient over voltage pulses. Leakage can be improved if needed using additional circuitry.

As has been described above, some of the embodiments have an aim of providing a combined analog High side and Low side driver on one output pin, selectable by an internal signal.

The driver is able to handle conditions such as mis-wiring (without external current limitation), and relatively high EMC requirements (DPI, BCI, field, Transient over-voltage pulses, . . . ) as found in automotive environments. An output has to be able to go 5.5 V above and 5.5 V below supply (VCC/VSS) with very low current from the output pin (<1μA).

Advantages of some embodiments include:

Good EMC performance while the driver OUT current during the negative part of the disturbance period is fully under control. The driver output OUT can be pulled below ground (by transient overvoltage pulses or due to mis-wiring), indefinitely without significant output current. Protection for a fault condition of a missing ground connection can be implemented.

For embodiments having no PDMOS in the driver signal path, less chip area is needed as the modern vertical NDMOSes are for the same drain currents much smaller, and there is no need for the negative charge pump for the driver output stage. Other variations and additions can be envisaged within the scope of the claims.

What is claimed is:

1. An output driver, comprising:
a circuit having first and second inputs and an output node;
a first control circuit coupled between the output node of the circuit and the first input of the circuit, wherein the first control circuit controls a parameter at the output node in accordance with a signal at the first input and when a current flow through the output node and the circuit is in a first direction; and
a second control circuit coupled between the output node of the circuit and the second input of the circuit, wherein the second control circuit inhibits the current flow through the output node and the circuit in a second direction.

2. The output driver of claim 1, wherein the circuit comprises:
a first transistor having first and second main electrodes and a control electrode, the first main electrode coupled to a first source of operating potential and the control electrode serving as the first input of the circuit; and
a second transistor having first and second main electrodes and a control electrode, the second main electrode of the second transistor coupled to the second main electrode of the first transistor and the control electrode serving as the second input of the circuit.

3. The output driver of claim 2, wherein the second transistor comprises a first body of semiconductor material and the second transistor comprises a second body of semiconductor material, and wherein the body of the first transistor is coupled for receiving a first source of operating potential and the body of the second transistor is coupled to the output node.

4. The output driver of claim 2, wherein the first control circuit controls the first transistor as a controlled current source.

5. The output driver of claim 2, wherein the first and second control circuits cooperate to limit the first current in the first and second directions substantially symmetrically during an EMC disturbance.

6. The output driver of claim 2, wherein the second control circuit biases the second transistor to conduct the current when a desired voltage at the output node is within a diode threshold voltage of the first operating potential.

7. The output driver of claim 2, wherein the first control circuit has a gain bandwidth (GBW) below a first frequency when EMC disturbances are higher than the first frequency.

8. An output driver circuit, comprising:
   a first transistor having a control electrode and first and second main electrodes, the first transistor of a first type;
   a second transistor having a control electrode and first and second main electrodes, the first main electrode of the first transistor coupled for receiving a first source of operating potential, the second main electrode of the first transistor coupled to the second main electrode of the second transistor, the first main electrode of the second transistor coupled to an output node, wherein the second transistor is of the first type;
   a first control loop coupled between the output node and the control electrode of the first transistor, the first control loop including a feedback path; and
   a second control loop coupled between the output node and the control electrode of the second transistor, the second control loop including a portion of the feedback path.

9. The output driver circuit of claim 8, wherein the first control loop comprises:
   a feedback network having a first input coupled to the output node, a second input coupled for receiving the first source of operating potential, and an output; and
   a transconductance amplifier having a first input, a second input coupled to the output of the feedback network, and an output coupled to the control electrode of the first transistor.

10. The output driver circuit of claim 9, wherein the second control circuit comprises:
    a feedback network; and
    the transconductance amplifier, wherein the output is coupled to the control electrode of the second transistor.

11. The output driver circuit of claim 9, wherein the first control loop comprises:
    a first current mirroring transistor having first and second main electrodes and a control electrode, the second main electrode coupled to the control electrode of the first current mirroring transistor and to the control electrode of the first transistor; and
    a current mirror having an input and at least one output, the input coupled to the output of the transconductance amplifier and a first output of the at least one output coupled to the control electrode of the first transistor.

12. The output driver circuit of claim 11, wherein the second control loop comprises:
    a second mirroring transistor having a control electrode and first and second main electrodes, the second main electrode coupled to the control electrode of the second transistor and to the control electrode of the second mirroring transistor; and
    wherein
    the current mirror includes a second output coupled to at least the control electrode of the second transistor.

13. The output driver circuit of claim 12, further including a first intrinsic diode coupled between the at least one output and the second mirroring transistor.

14. The output driver of claim 12, further including a third transistor having a control electrode and first and second main electrodes, the control electrode coupled to the output node, the second main electrode coupled to the at least one output, and the first main electrode coupled to the second transistor.

15. The output driver of claim 14, further including a Zener diode coupled between the third transistor and the output node.

16. The output driver of claim 15, further including a first current source coupled to the Zener diode.

17. The output driver of claim 14, further including a current switch having first and second nodes, wherein the first node is coupled to a first current source and the second node is coupled to the third transistor.

18. The output driver circuit of claim 17, further including a resistor coupled between the first current switch and the third transistor.

19. The output driver of claim 18, wherein the current switch comprises:
    a fourth transistor of a second type having a control electrode and first and second main electrodes, the second main electrode coupled to the first current source; and
    a fifth transistor of the second type having a control electrode and first and second main electrodes, the control electrode of the fifth transistor coupled to the control electrode of the fourth transistor, the first main electrode of the fifth transistor coupled to the main electrode of the fourth transistor, and the second main electrode of the fifth transistor coupled to the resistor.

20. The output driver circuit of claim 19, further including:
    a sixth transistor having a control electrode and first and second main electrodes, the control electrode coupled for receiving a second source of operating potential, the second main electrode coupled to the control electrodes of the fourth and fifth transistors; and
    a second current source having first and second main electrodes, the first main electrode coupled to the first main electrode of the sixth transistor.

21. The output driver of claim 12, further including a first resistor coupled between the second transistor and the output node.

22. The output driver of claim 21, further including a second resistor coupled to the gate of the first transistor and a second terminal coupled for receiving the first source of operating potential.

23. The output driver of claim 8, further including a resistor coupled to the first transistor.

24. The output driver circuit of claim 8, wherein the first transistor has a bulk region coupled for receiving the first source of operating potential and the second transistor has a bulk region coupled to the output node.

25. The output driver circuit of claim 8, further including:
    a first intrinsic diode coupled between the first and second main electrodes of the first transistor; and
    a second intrinsic diode coupled between the first and second main electrodes of the second transistor.

26. The output driver circuit of claim 8, wherein the first type is an N-type of transistor.

27. The output driver of claim 8, wherein the first control loop has a gain bandwidth below a first frequency which is lower than a frequency of an EMC disturbance.

28. The output driver of claim 8, wherein the first and second control loops use the same error signal.

29. The output driver circuit of claim 8, wherein the first control loop and the second control loop operate simultaneously.

30. A method of operating a driver circuit having first and second transistors serially coupled between an output node and a source of operating potential, comprising:
    controlling a current flowing through the first and second transistors by operating the first transistor as a controlled current source when the current flows through the output node in a first direction; and operating the second transistor as another controlled current source when the current flows through the output node in a second direction.

31. The method of claim 30, further comprising:

using a first control signal to operate the first transistor as the controlled current source; and using a second control signal to operate the second transistor as the another controlled current source.

32. The method of claim 30, further including operating the second transistor as a controlled current source when an output voltage is lower than a source of operating potential and operating the second transistor as a closed switch when the output voltage is higher than the source of operating potential.

33. The method of claim 30, further including operating the second transistor as the another controlled current source when an output voltage is higher than a source of operating potential and operating the second transistor as a closed switch when the output voltage is lower than the source of operating potential.

34. A method for protecting a circuit during a failure mode operating condition, comprising:

generating a current from a first controlled current source, wherein the first controlled current source comprises a first transistor of a first conduction type that has a bulk region coupled for receiving a first source of operating potential and wherein the current flows through an output node in a first direction; and generating the current from a second controlled current source, wherein the second controlled current source comprises a second transistor of the first conduction type that has a bulk region coupled to the output node and wherein the current flows through the output node in a second direction.

* * * * *